(12) United States Patent
Schuette

(10) Patent No.: US 8,037,927 B2
(45) Date of Patent: Oct. 18, 2011

(54) COOLING DEVICE FOR AN ELECTRONIC COMPONENT

(75) Inventor: Franz Michael Schuette, Colorado Springs, CO (US)

(73) Assignee: CUI Global, Inc., Tualatin, OR (US)

( * ) Notice: Subject to any disclaimer, the term of this patent is extended or adjusted under 35 U.S.C. 154(b) by 1005 days.

(21) Appl. No.: 11/941,550

(22) Filed: Nov. 16, 2007

(65) Prior Publication Data

US 2008/0115916 A1 May 22, 2008

Related U.S. Application Data

(60) Provisional application No. 60/866,140, filed on Nov. 16, 2006.

(51) Int. Cl.
*F28D 15/00* (2006.01)
*F28F 7/00* (2006.01)
*H05K 7/20* (2006.01)

(52) U.S. Cl. ............. 165/104.26; 165/104.33; 165/80.4; 361/700

(58) Field of Classification Search ............. 165/104.26, 165/104.33, 80.4; 361/700
See application file for complete search history.

(56) References Cited

U.S. PATENT DOCUMENTS

| | | | |
|---|---|---|---|
| 4,450,472 A | 5/1984 | Tuckerman et al. | |
| 5,388,635 A * | 2/1995 | Gruber et al. ................. | 165/80.4 |
| 5,719,444 A | 2/1998 | Tilton et al. | |
| 5,801,442 A | 9/1998 | Hamilton et al. | |
| 6,156,273 A * | 12/2000 | Regnier et al. ................. | 422/70 |
| 6,672,502 B1 | 1/2004 | Paul et al. | |
| 6,675,875 B1 | 1/2004 | Vafai et al. | |
| 6,692,700 B2 | 2/2004 | Handique | |
| 6,785,134 B2 | 8/2004 | Mareety et al. | |
| 6,793,831 B1 | 9/2004 | Paul et al. | |
| 6,812,563 B2 | 11/2004 | Go et al. | |
| 6,904,966 B2 | 6/2005 | Philpott et al. | |
| 6,934,154 B2 | 8/2005 | Prasher et al. | |
| 6,942,018 B2 | 9/2005 | Goodson et al. | |
| 6,989,134 B2 | 1/2006 | Tonkovich et al. | |
| 6,991,024 B2 | 1/2006 | Goodson et al. | |
| 7,000,684 B2 | 2/2006 | Kenny et al. | |
| 7,219,715 B2 * | 5/2007 | Popovich ..................... | 165/80.4 |
| 2005/0082037 A1 * | 4/2005 | Thayer et al. ................. | 165/80.4 |

\* cited by examiner

*Primary Examiner* — Judy Swann
*Assistant Examiner* — Ignacio E Landeros
(74) *Attorney, Agent, or Firm* — Hartman & Hartman, P.C.; Gary M. Hartman; Domenica N. S. Hartman

(57) ABSTRACT

A cooling device for cooling an electronic component. The device has an enclosure adapted to contain a liquid coolant. The enclosure has an internal channel system comprising a cavity adjacent the electronic component, a first group of arborizing channels adapted to carry the liquid coolant away from the cavity, a second group of arborizing channels adapted to carry the liquid coolant to the cavity, and a plenum fluidically connecting the first and seconds groups of arborizing channels. Each group of arborizing channels has a parent branch and multiple successive sets of daughter branches with successively smaller cross-sectional areas, wherein the sum of the cross-sectional areas of the daughter branches of any set is approximately the same as that of its parent branch. Distal sets of the daughter branches are most distant from the cavity, fluidically connected to the plenum, and have the smallest cross-sectional areas of the daughter branches.

15 Claims, 2 Drawing Sheets

US 8,037,927 B2

COOLING DEVICE FOR AN ELECTRONIC COMPONENT

CROSS REFERENCE TO RELATED APPLICATIONS

This application claims the benefit of U.S. Provisional Application No. 60/866,140, filed Nov. 16, 2006, the contents of which are incorporated herein by reference.

BACKGROUND OF THE INVENTION

The present invention generally relates to cooling systems for electronic components. More particularly, this invention relates to a sealed cooling device with enhanced thermal management capabilities.

Cooling of electronic devices has become increasingly challenging as electronics have evolved. As manufacturing processes are constantly refined, the migration to smaller design processes and the incumbent reduction in operating voltage has not kept pace with the increased complexity of faster integrated circuits (ICs). Increasing number of transistors in combination with increasing operating frequencies has resulted in higher numbers of switching events over time per device. As a result, within the same market space and price range, ICs are becoming more and more sophisticated and power-hungry with every generation.

Compared to earlier generations, the implementation of smaller design processes has allowed the integration of more electronic building blocks such as transistors and capacitors on the same footprint. Consequently, area power densities have increased, resulting in smaller dies dissipating higher thermal load. As a result, formerly sufficient, passive heat spreaders and coolers often do not provide adequate cooling. While sophisticated fin designs and powerful fans increase the active surface area useable for offloading thermal energy to the environment, even extremely well designed coolers are hitting inherent limitations. In particular, significant limitations stem from the bottleneck of limited heat conductivity of the materials used, and specifically the fact that passive heat transfer throughout a solid structure is limited by the coefficient of thermal conductivity (CTE) of the material and the cross sectional area of the structure.

In a two-dimensional heat spreader of uniform thickness, the amount of thermal energy decreases as a square function of the distance from the source, where the thermal conductance coefficient of the material and the cross sectional area define the slope of the decrease. Therefore, even the most highly conductive material will not be able to maintain an even temperature distribution across the entire surface of the cooling device. Any gradient, on the other hand, will cause a decrease in cooling efficiency since the temperature difference ($\Delta T$) between the cooler's surface and the environment is the primary limiting factor for thermal dissipation to the surrounding.

In view of the above, it is desired that coolers transfer heat from a heat source as quickly and efficiently as possible to optimize cooling efficiency for the heat source. In combustion engines, liquid cooling has become the method of choice, using the fact that a liquid (e.g., water) is taking up thermal energy and subsequently being pumped to a remote radiator where it releases the absorbed heat. In electronic devices, liquid cooling is still only marginally accepted for reasons that include the inherent risk of spills, cost overhead, and complexity of the installation, which involves routing of tubing and installation of radiators. Alternatively, some self-contained liquid cooling devices have been proposed and marketed.

Four primary factors defining the efficacy of a liquid cooling device are the uptake of heat by the cooling fluid at the heat source, the transport rate of the fluid away from the heat source, the offloading of heat to the solid components of the cooler, and finally the dissipation rate of heat into the environment. The exchange of heat between the heat source and the cooling fluid mainly depends on the surface area of the heat source that is exposed to the fluid in a direction normal to the plane of the heat source, for example, a semiconductor die. The exchange of heat between the fluid and the cooling device largely depends on the routing of the flow of the coolant within the device. If the channels are too wide, laminar flow can cause a decrease in efficacy of heat exchange between the fluid and the device. Therefore, it is desirable to have a capillary system to achieve an optimal surface to volume ratio. Such capillary systems have been referred to as microchannel systems.

One often overlooked problem with a nondescript microchannel system is that the hydraulics are poorly defined. If a pump simply pumps the fluid through the interstitial space without further routing in the form of macrochannels, then the centrifugal movement of the fluid can easily interfere with the centripetal flow that recycles the fluid back to the pump. A number of workaround possibilities have been proposed, among which is the separation of the centrifugal and the centripetal fluid movements into two individual planes that are separated by a septum. In other words, centrifugal flow of the fluid may occur within a lower plane whereas the centripetal "suction" of the fluid back to the pump may occur in an upper layer. This separates the centrifugal from the centripetal channel and as a consequence the pump does not have to work against itself.

A natural occurrence of such a "counter-flow" system is known as rete mirabile or wonder mesh in biomedical sciences. A relevant example in this context is the micro-vascularization in the feet of aquatic birds where, within less than one centimeter, the blood temperature drops in the arterial path from about 38° C. to the outside temperature, and then warms back up to body temperature in the venous path. The temperature change or rather exchange between the two paths occurs in an entirely passive manner, that is, without the addition of any extra energy. In other words, having liquids flow in opposite direction through adjacent capillary networks or microchannels can create the effect of a very efficient thermal isolation between two points. However, in the case of a cooling apparatus, such an effect is highly undesirable since heat would be trapped at its source despite all fluid movement. Consequently, it appears highly disadvantageous in a heat exchange apparatus to have flow and counter flow in immediate proximity, especially if the septum between outgoing and incoming channels is thermally conductive.

An online publication by C. Hammerschmidt, "IBM Technology Keeps Future Chips Cool," EE Times Online, http://www.eetimes.com/news/semi/showArticle.jhtml;jsessionid = N3LUY22LJ4EB MQSND LSCKHA? articleID= 193402569 (visited 16 Nov. 2006), describes an approach by IBM using direct jet impingement. This technology uses water jets sprayed with several tens of thousands of micro-nozzles onto an integrated circuit as the primary cooling technique in combination with a tree-like branched return architecture also referred to as hierarchical channel system.

The use of microchannels for coolant fluids has been known for some time, as evidenced by U.S. Pat. No. 4,450, 472 to Tuckerman et al. The preferred embodiment featured in this patent integrates microchannels into the die of a microchip to be cooled and coolant chambers. U.S. Pat. No. 5,801,442 also describes a similar approach. Still other approaches have focused on the combined use of coolant phase change (condensation) and microchannels, an example of which is U.S. Pat. No. 6,812,563. U.S. Pat. No. 6,934,154 describes a similar two-phase approach including an enhanced interface between an IC die and a heatspreader based on a flip-chip design and the use of a thermal interface material. U.S. Pat. Nos. 6,991,024, 6,942,018, and 6,785,134 describe electroosmotic pump mechanisms and vertical channels for increased heat transfer efficiencies. Variations of microchannel designs include vertical stacking of different orientational channel blocks as described in U.S. Pat. No. 6,675,875, flexible microchannel designs using patterned polyimide sheets as described in U.S. Pat. No. 6,904,966, and integrated heating/cooling pads for thermal regulation as described in U.S. Pat. No. 6,692,700.

Additional efforts have been directed to the manufacturing of microchannels. U.S. Pat. Nos. 7,000,684, 6,793,831, 6,672,502, and 6,989,134 are representative examples, and disclose forming microchannels by sawing, stamping, crosscutting, laser drilling, soft lithography, injection molding, electrodeposition, microetching, photoablation chemical micromachining, electrochemical micromachining, throughmask electrochemical micromachining, plasma etching, water jet, abrasive water jet, electrodischarge machining (EDM), pressing, folding, twisting, stretching, shrinking, deforming, and combinations thereof. However, these methods do not describe in any detail the geometry of the fluid circulatory system.

The use of a mesh to increase surface contact area with a cooling fluid has also been proposed. For example, meshes have been employed as condensers in evaporative cooling systems. Meshes have also been employed in the context of increasing contact with a cooling fluid used to cool semiconductor devices, for example, as described in U.S. Pat. No. 5,719,444 to Tilton et al. Commonly-assigned U.S. Pat. No. 7,219,715 to Popovich, the contents of which are incorporated herein by reference, describes an alternative approach using a mesh or woven screen that is between and bonded to two foils that define a flow cavity. With this approach, the interstices between the warp and weft strands of the mesh, as well as the gaps between the strands and the bordering foils, allow the passage of a cooling fluid, providing direct contact with the fluid for heat absorption and transfer heat through the bonding contacts with the foils. Both Tilton et al. and Popovich describe the semiconductor device being immersed in the cooling fluid.

BRIEF SUMMARY OF THE INVENTION

The present invention provides a cooling device that uses spatial and thermal separation between centrifugal and centripetal pathways in a channel system containing a fluid coolant. The device is particularly well suited for cooling heat sources from which heat can be conducted in a generally radial outward direction, as in the case of semiconductor devices.

The cooling device generally includes an enclosure adapted to contain a liquid coolant and comprising oppositely-disposed first and second walls. A surface portion of the first wall is adapted to attach the electronic component thereto. The enclosure has an internal channel system that includes a cavity adjacent the surface portion of the first wall, a first group of arborizing channels adapted to carry the liquid coolant away from the cavity, a second group of arborizing channels adapted to carry the liquid coolant to the cavity, and a plenum fluidically connecting the first and seconds groups of arborizing channels. Each of the first and second groups of arborizing channels has a parent branch and multiple successive sets of daughter branches with successively smaller cross-sectional areas, and the sum of the cross-sectional areas of the daughter branches of any set is approximately the same as that of the parent branch thereof. A distal set of the daughter branches of each of the first and second groups of arborizing channels is most distant from the cavity, fluidically connected to the plenum, and has the smallest cross-sectional areas of the daughter branches. Finally, a pump provides for movement of the liquid coolant through the first and second groups of arborizing channels.

The cooling device as recited above targets the immediate removal of a liquid heated by a heat source away from the heat source, and its distribution throughout a hierarchical channel system in the device. Outbound and inbound groups of channels are spatially separated in order to avoid thermal exchange between the groups of channels that would undesirably create a rete mirabile effect. Throughout the channel system, a substantially uniform cross sectional area of each generation of branches is maintained, thereby avoiding bottlenecks that would negatively impact the efficacy of the pump used to circulate the fluid and result in flow asymmetries.

In view of the above, advantages of the present invention include rapid removal of heat from a heat source, separation of cooler (inbound) and hotter (outbound) fluid channels, fractal arborization of channels for efficient area coverage, and maintenance of overall channel cross-sectional area through all generations of branching. The invention also offers the capability of a cost-effective cooling solution because of the capability of employing inexpensive materials, and good scalability into large-scale cooling devices.

Other objects and advantages of this invention will be better appreciated from the following detailed description.

DETAILED DESCRIPTION OF THE INVENTION

Figure 1:
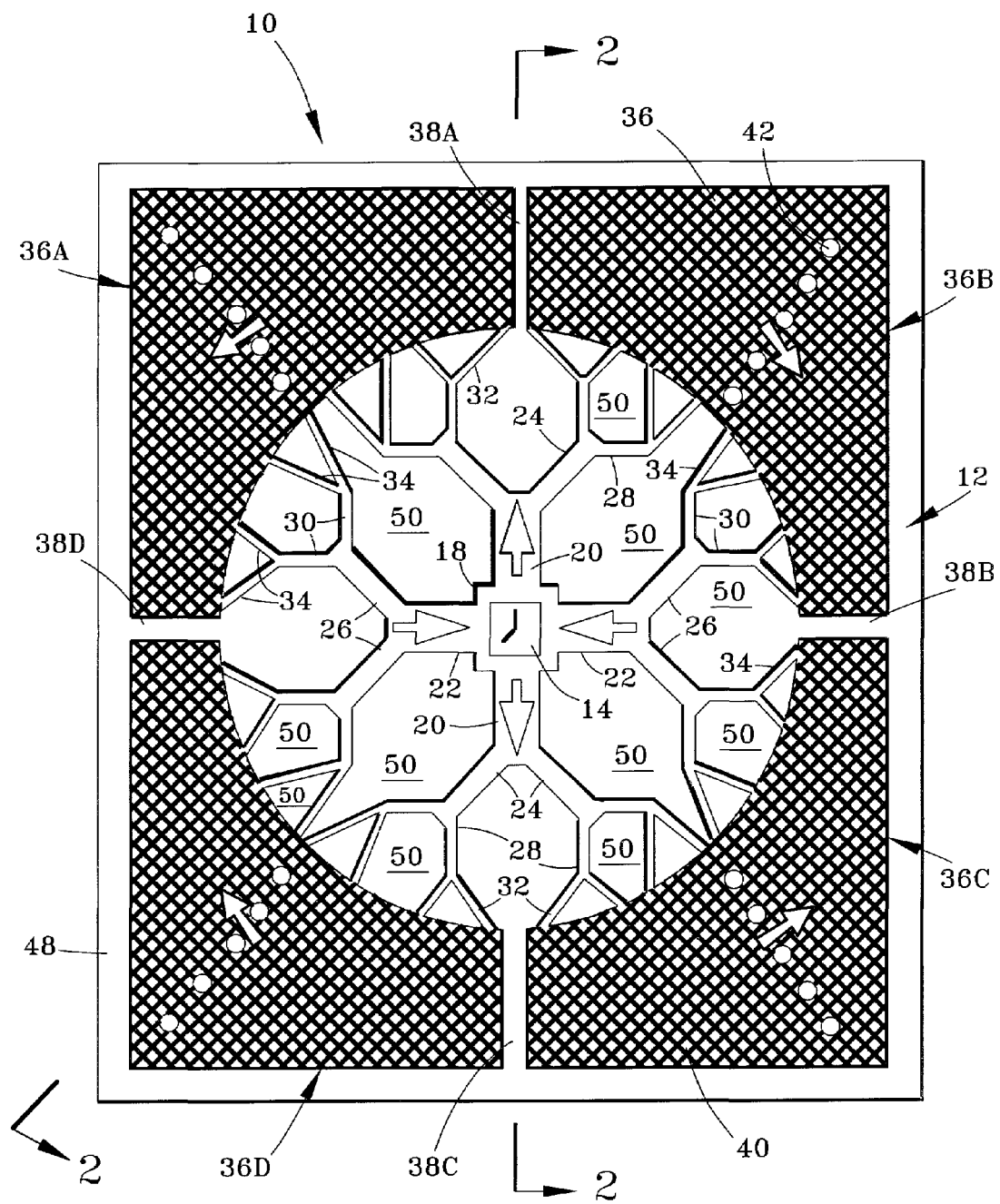
FIG. 1 is shows a cooling plate adapted for cooling a semiconductor device in accordance with an embodiment of the invention, with an outer wall removed to reveal a channel system within the cooling plate.

FIG. 1 shows a schematic overview of a channel system 12 defined in a cooling plate 10 adapted for cooling a semiconductor device 14. The location of the device 14 relative to the channel system 12 is superimposed in FIG. 1, though it is to be understood that the device 14 is not required to be located within the channel system 12. Instead, the device 14 may be limited to contact with an outer wall 16 (FIG. 2) of the cooling plate 10 that encloses the channel system 12 and separates the channel system 12 from the device 14, or may be partially inserted into the channel system 12 through the wall 16 (FIG. 3). The channel system 12 is delimited by the outer wall 16 and a base wall 46 (FIGS. 2 and 3), as well as structures 38A-38D, 48, and 50 between the outer and base walls 16 and 46, as discussed in more detail below. The channel system 12 can be defined in the base wall 46 of the plate 10, such as by etching the base wall 46, or can be patterned in a layer sandwiched between the outer and base walls 16 and 46. Other construction and fabrication approaches could be foreseeably used, and are within the scope of this invention.

The channel system 12 is shown in FIG. 1 as having a central cavity 18 aligned with the device 14. The cavity 18 is fluidically connected to two primary outbound branches 20 and two primary inbound branches 22. The flow directions within these branches 20 and 22 are identified with arrows, which point radially outward (outbound from the device 14) or radially inward (inbound toward the device 14), respectively. Each outbound and inbound branch 20 and 22 is fluidically connected to a set of smaller daughter branches 24 and 26, which in turn are fluidically connected to progressively smaller sets of daughter branches 28, 30, 32, and 34. The smallest sets of daughter branches 32 and 34 are fluidically connected to an outer plenum 36 that surrounds the branches 20, 22, 24, 26, 28, 32, and 34, and in turn is surrounded and enclosed by a peripheral wall 48 of the plate 10. As a result, each outbound branch 20 is fluidically connected to the plenum 36 via eight different outbound flow routes, and each inbound branch 22 is fluidically connected to the plenum 36 via eight different inbound flow routes. Furthermore, the channel system 12 is divided into distinct and spatially separated groups, namely, the outbound (centrifugal) branches 20 and their respective sets of daughter branches 24, 28, and 32 and the inbound (centripetal) branches 22 and their respective sets daughter branches 26, 30, and 34 are all spatially separated from each other.

The parent branches 20 and 22 and their daughter branches 24, 26, 28, 30, 32, and 34 are defined by a pattern of structures 50 within a circular-shaped interior region of the plate 10. The multiple outbound flow routes formed by each branch 20 and its corresponding daughter branches 24, 28 and 32 and the multiple inbound flow routes formed by each branch 22 and its corresponding daughter branches 26, 30 and 34 can be readily devised to be of approximately equal length, since their radially outermost (distal) extents are at their junctions with the plenum 36, and these junctions are equidistant from the cavity 18 as a result of the circular shape of the interior region containing the structures 50. The pattern of structures 50 is represented as being symmetrical about at least two axes (a first axis passing through two oppositely-disposed radial walls 38A and 38C, and a second axis passing through two oppositely-disposed radial walls 38B and 38D), though such symmetry is not a requirement.

The plenum 36 is made up of four quadrants 36A, 36B, 36C, and 36D separated by the four radial walls 38A, 38B, 38C, and 38D, respectively. The plenum 36 (or at least each of its quadrants 36A, 36B, 36C, and 36D) contains a mesh 40 that defines what are termed herein microchannels. Fluid flow within each plenum quadrant 36A, 36B, 36C, and 36D is guided by spacers 42. Based on the fluid flow directions indicated for the outbound and inbound branches 20 and 22 and the locations of the radial walls 38A, 38B, 38C, and 38D, the general flow direction through the microchannels of the quadrants 36A and 36C is in a counterclockwise direction and the general flow direction through the microchannels of the remaining quadrants 36B and 36D is in the clockwise direction, as indicated by the arrows superimposed within these quadrants 36A-D.

Figure 2:
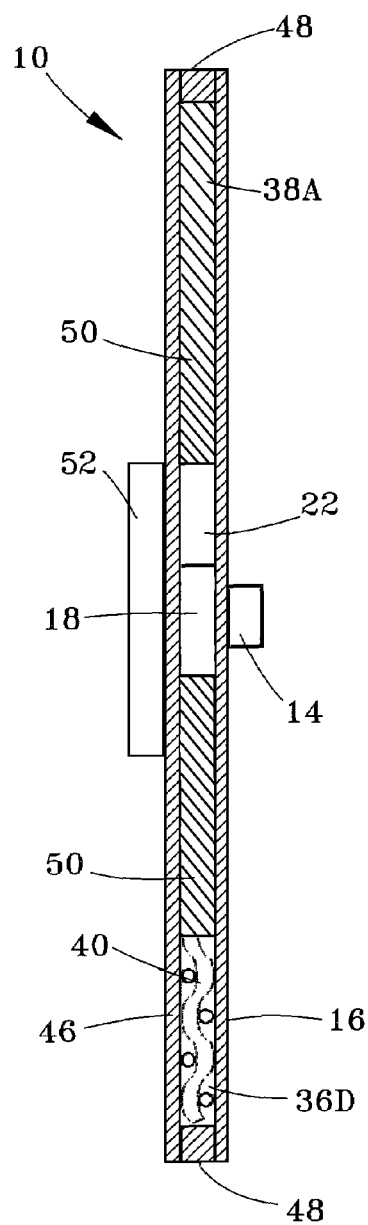
FIG. 2 is a cross-sectional view illustrating the cooling plate of FIG. 1, and showing the outer wall enclosing the channel system and a semiconductor device attached to the outer wall.
Figure 3:
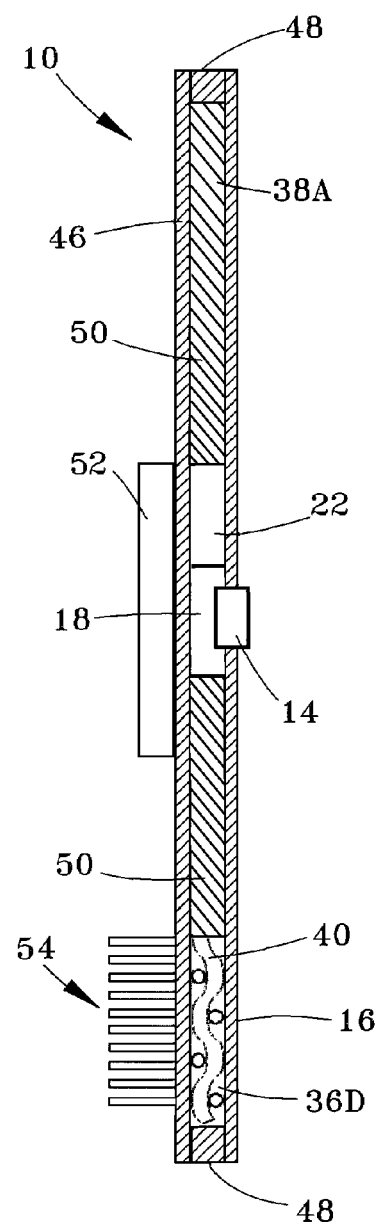
FIG. 3 is a cross-sectional view illustrating an alternative embodiment for the cooling plate of FIGS. 1 and 2, showing the semiconductor device in direct contact with a liquid coolant within the channel system.

As represented in FIGS. 2 and 3, the mesh 40 within the plenum 36 preferably has essentially the same thickness as the height of the plenum 36. The peaks projecting from both sides of the mesh 40 are preferably bonded, such as by soldering or brazing, to the walls 16 and 46 of the plate 10 to establish a highly-conductive thermal contact between the mesh 40 and walls 16 and 46. Bonding also serves to cross-link the walls 16 and 46, which resists any shearing forces to which the walls 16 and 46 might be subjected and contributes additional mechanical stability and rigidity to the plate 10. The warp and weft strands of the mesh 40 form interstices that are more or less freely penetrable by any fluid, yet define tortuous paths that avoid laminar flow conditions within the plenum 36 that would reduce the heat transfer rate between the cooling fluid, the walls 16 and 46, and the mesh 40.

The geometry of the channel system 12 shown in FIG. 1 is generally two-dimensional, with a single-point heat source defined by the semiconductor device 14, and an outer periphery towards which heat is conducted through the plate 10. Analogous to two-dimensional flow of fluid from a single-point source, the flow of thermal energy from the device 14 is a square function of the dissipated power with the distance from the device 14. In other words, as one doubles the distance from the device 14, the area that can or needs to be serviced increases by a factor of four. The present invention provides an effective balance between this characteristic of two-dimensional thermal and fluid flow by the use of a technology called arborization, and using fractal algorithms. For a given increase in distance from the central cavity 18 (and therefore the device 14 aligned therewith), each parent branch 20 and 22, each successive set of daughter branches 24 and 26, and each successive daughter branches 28 and 30 splits into multiple daughter branches (hence, defining an arborization pattern), and the combined cross-sectional area of each set of daughter branches 24, 26, 28, 30, 32, and 34 is approximately equal to the cross-sectional area of its respective parent branch 20 or 22. In the example of FIG. 1, each branch 20 splits into two daughter branches 24 each having roughly half the cross-sectional area of its parent branch 20, each branch 24 splits into two daughter branches 28 each having roughly half the cross-sectional area of each branch 24, and each branch 28 splits into two daughter branches 32 each having roughly half the cross-sectional area of each branch 28. In this way, the total cross-sectional area within each inbound and outbound group of channels remains constant, regardless of the distance from the central cavity 18, such that a constant flow rate is maintained throughout the system 12 at constant pressure. Even if the combined cross-sectional areas for a given set of daughter branches do not precisely follow this rule, the channel system 12 design will still provide for substantially even flow throughout the system 12 without imposing bottlenecks and consequent pressure gradients that negatively impact the efficacy of a pump used to circulate a fluid flowing through the system 12.

In view of the above, the cooling plate 10 contains a hierarchical channel system 12 of multiple arborizing flow routes, defining an arborization pattern at whose outer periphery is the plenum 36. The plenum 36 provides a globally defined flow direction within each plenum quadrant 36A-D that transitions from the centrifugal (outbound) flow routes to the centripetal (inbound) flow routes, and the mesh 40 within the plenum 36 defines a microchannel system that optimizes the transfer of thermal energy from the fluid within the plenum 36 to the walls 16 and 46 of the plate 10. Because the plenum 36 is divided into fluidically separated sections 36A-D in the manner shown in FIG. 1, each individual quadrant 36A-D is fluidically connected to one-half of the distal set 32 of daughter branches of one of the outbound groups of channels 20, 24, 28 and 32, and to one-half of the distal set 34 of daughter branches of one of the inbound groups of channels 22, 26, 30, and 34.

From the foregoing, it should be understood that the number of groups of channels and the number of branches within each group is not critical, as long as multiple arborizing flow routes are defined and a substantially constant flow rate is maintained throughout the system 12 at substantially constant pressure.

The cooling plate 10 described above is well suited as a fluid cooling device for electronic components with high power densities. The hierarchical channel system 12 of the plate 10 routes a cooling fluid in a generally radial outward direction from the device 14 to the periphery of the cooling plate 10, and subsequently collects the fluid from the periphery and returns the fluid to the device 14. In the embodiment shown in FIG. 1, the centrifugal and centripetal groups of arborized channels within the channel system 12 are sufficiently spatially separated to the point where there is insubstantial thermal exchange between the heated outbound fluid (flowing in the centrifugal branches 20, 24, 28, and 32) and the cooled inbound fluid (flowing in the centripetal branches 22, 26, 30, and 34). The arborization pattern of the channel system 12 further allows the distribution of the heated fluid over a larger surface area than would be possible through a simple stub leading into the microchannel network within the plenum 36.

Within the immediate vicinity of the device 14, the material of the plate 10 is generally sufficient to conduct heat away from the device 14, and therefore does not require (though may be provided with) microchannels similar to that provided by the mesh 40 within the plenum 36. As noted above, with increasing distance from the device 14, the arborization pattern of the channel system 12 becomes more pronounced to maintain essentially the same flow cross-sectional area. The surface areas of the walls 16 and 46 enclosing the branches 20, 22, 24, 26, 28, 30, 32, and 34 act as the primary heat exchange interfaces between the plate 10 and the surrounding environment. Because the effective cross-sectional area of any given branch 20 or 22 and its daughter branches does not change, the velocity of fluid flow therethrough remains substantially constant and the fluid flows relatively quickly to the plenum 36 and its microchannels, which act as a secondary heat exchange interface with the surrounding environment.

The cooling fluid is preferably pumped through the channel system 12 with a pump 52, such as a centrifugal pump, connected to either the central cavity 18 or the plenum 36. The choice of pump is primarily dependent on the specific application since pressure and noise requirements need to be taken into consideration. In a closed hydraulic system such as the channel system 12 of the invention, any pumping or positive displacement of a fluid will be equal to the suction of the inbound path. Positive displacement is generally considered more efficient than suction, suggesting that the pump 52 is preferably coupled to the channel system 12 so that cooling fluid is drawn from the inbound branches 22 and discharged to the outbound branches 20.

If a positive displacement pump is coupled to the channel system 12 to discharge fluid to the outbound branches 20, the tortuosity of the outbound branches 20 and/or any or all of their daughter branches 24, 28, and 32 can be increased by, for example, inserting a mesh (not shown). The cross-sectional area of any higher order branch 24, 28, or 32 containing a mesh should be appropriately increased to compensate for the mesh, so that the sum of the microchannels created by the mesh interstices will match the cross-sectional area of the lower order branches 20, 24, and 28 from which the fluid flows. The desirability of adding or omitting a mesh in the outbound branches 20, 24, 28, and 32 will depend on the specific design and application.

The inbound branches 22 and their daughter branches 26, 30, and 34 are primarily for collection of the cooled fluid from the plenum 36. Within the higher order branches 26, 30, and 34, a certain amount of heat exchange with the walls 16 and 46 is not only possible but also desirable for increased surface utilization of the cooling plate 10. In the proximity of the semiconductor device 14, however, it is advantageous to avoid excessive heat exchange with the walls 16 and 46 in order to maintain the lowest possible temperature of the coolant until it reaches the immediate area of the semiconductor device 14.

As generally known in the art, suitable coolant fluids include liquids such as water, mineral spirits/oils, alcohols, and fluorocarbonate derivatives, though various other fluids could also be used, including air, vapor, etc., depending on the required temperature range of operation. For example, in extremely cold environments, a fluid with lower viscosity is a better choice than in extremely hot environments. Various other parameters for choosing a cooling fluid exist and are well known, and therefore will not be discussed in any further detail here.

The embodiment of the cooling plate 10 shown in FIGS. 1 and 2 is self-contained and hermetically sealed to allow easy mounting of a wide variety of heat sources. Though a loss in thermal transfer is generally incurred where a heat source is hermetically sealed from the coolant used to cool the heat source, the greatest challenge of thermal management is more often the dissipation of heat from the cooling device into the surrounding environment rather than heat transfer from the heat source to the cooling device. Moreover, the current invention allows the device 14 to be attached directly to the outer wall 16 as shown in FIG. 2, as well as the integration of a heat slug (not shown) into or on the surface of the outer wall 16. In the latter case, the slug may directly contact the semiconductor device 14 and wall 16, and provide sufficient thermal capacitance to buffer transient temperature spikes of the semiconductor device 14. Transfer of thermal energy from the heat slug (or any other structure in contact with the semiconductor device 14) to the wall 16 can be augmented by a thermally conductive mesh between the slug and wall 16. The inclusion of a mesh at the contact area between the semiconductor device 14 and the wall 16 also avoids the potential for localized boiling of the cooling fluid at the interior surface of the wall 16 opposite the device 14, which could result in greatly reduced cooling efficacy of the cooling plate 10.

As an alternative to FIG. 2, FIG. 3 shows that it is possible to partially immerse the semiconductor device 14 in the cooling fluid through an opening in that portion of the outer wall 16 enclosing the central cavity 18. For better heat uptake, a screen or mesh may be placed within the cavity 18 and in contact with the semiconductor device 14.

Because the wall 16 of the cooling plate 10 only plays a supportive role in transferring heat away from the device 14, the CTE of the material(s) used to form the cooling plate 10, its walls 16 and 46, and its internal structures 50 is less important than in cooling structures that rely solely on passive heat transfer. As such, a wider variety of materials could be used to form the cooling plate 10 and its components. Moreover, because the cooling plate 10 is hollow, the total amount of material used is substantially lower than in a comparable solid structure, resulting in reduced material costs for manufacturing the plate 10. A related issue is the mechanical stability of the cooling plate 10. Hollow structures generally exhibit only a minor reduction in rigidity as compared to a solid body of the same dimensions. The rigidity of the plate 10 is promoted as a result of the mesh 40 being bonded to both walls 16 and 46. Consequently, the cooling plate 10 can be much lighter but yet nearly as strong and rigid as a solid heat spreader of comparable size. The outer surfaces of both walls 16 and 46 can be outfitted with fins (54 in FIG. 3) in order to increase the effective surface area of the plate 10 and, thus, facilitate offloading of the heat to the surrounding environment.

While the invention has been described in terms of specific embodiments, it is apparent that other forms could be adopted by one skilled in the art. For example, the functions of the components of the cooling plate 10 could be performed by components of different construction but capable of a similar (though not necessarily equivalent) function, the plate 10 and its components could differ in appearance and construction from the embodiments shown in the Figures, and appropriate materials could be substituted for those noted. Therefore, the scope of the invention is to be limited only by the following claims.

The invention claimed is:

1. A cooling device for cooling an electronic component, the cooling device comprising:
an enclosure adapted to contain a liquid coolant, the enclosure comprising oppositely-disposed first and second walls, a surface portion of the first wall being adapted to attach the electronic component thereto, the enclosure having an internal channel system comprising:
a cavity adjacent the surface portion of the first wall;
a first group of arborizing channels adapted to carry the liquid coolant away from the cavity;
a second group of arborizing channels adapted to carry the liquid coolant to the cavity;
a third group of arborizing channels adapted to carry the liquid coolant away from the cavity;
a fourth group of arborizing channels adapted to carry the liquid coolant to the cavity; and
a plenum fluidically connecting the first and second groups of arborizing channels and fluidically connecting the third and fourth groups of arborizing channels;
each of the first and second groups of arborizing channels comprising a parent branch and multiple successive sets of daughter branches with successively smaller cross-sectional areas, wherein the sum of the cross-sectional areas of the daughter branches of any set is approximately the same as that of the parent branch thereof, a distal set of the daughter branches of each of the first and second groups of arborizing channels being most distant from the cavity, fluidically connected to the plenum, and having the smallest cross-sectional areas of the daughter branches;
each of the third and fourth groups of arborizing channels comprising a parent branch and multiple successive sets of daughter branches with successively smaller cross-sectional areas, wherein the sum of the cross-sectional areas of the daughter branches of any set is approximately the same as that of the parent branch thereof, a distal set of daughter branches of each of the third and fourth groups of arborizing channels being most distant from the cavity, fluidically connected to the plenum, and having the smallest cross-sectional areas of the daughter branches; and
a pump for movement of the liquid coolant through the first, second, third and fourth groups of arborizing channels;

wherein:
some but not all of the distal set of daughter branches of the first group of arborizing channels are fluidically connected by the plenum to some but not all of the distal set of daughter branches of the second group of arborizing channels;
some but not all of the distal set of daughter branches of the first group of arborizing channels are fluidically connected by the plenum to some but not all of the distal set of daughter branches of the fourth group of arborizing channels;
some but not all of the distal set of daughter branches of the third group of arborizing channels are fluidically connected by the plenum to some but not all of the distal set of daughter branches of the second group of arborizing channels; and
some but not all of the distal set of daughter branches of the third group of arborizing channels are fluidically connected by the plenum to some but not all of the distal set of daughter branches of the fourth group of arborizing channels.

2. The cooling device of claim 1, further comprising a mesh within the plenum and in thermally conductive contact with the first and second walls of the enclosure.

3. The cooling device of claim 1, wherein the component is attached to an outer surface of the first wall so as not to contact the liquid coolant when present in the cavity.

4. The cooling device of claim 1, wherein the component passes through the first wall so as to directly contact the liquid coolant when present in the cavity.

5. The cooling device of claim 1, wherein the liquid coolant is hermetically enclosed within the cooling device.

6. The cooling device of claim 1, wherein the pump draws the liquid coolant from the second group of arborizing channels and delivers the liquid coolant to the first group of arborizing channels.

7. The cooling device of claim 1, wherein the first and third groups of arborizing channels are on opposite sides of the cavity, and the second and fourth groups of arborizing channels are on opposite sides of the cavity.

8. The cooling device of claim 1, wherein the plenum is divided into fluidically separated sections, each of the sections fluidically connecting some but not all of the distal set of daughter branches of the first group of arborizing channels to some but not all of the distal set of daughter branches of the second group of arborizing channels.

9. The cooling device of claim 1, wherein the first and second groups of arborizing channels are entirely surrounded by the plenum.

10. The cooling device of claim 1, further comprising cooling fins extending from at least one of the first and second walls.

11. The cooling device of claim 9, wherein the cooling fins are located on portions of the at least one of the first and second walls enclosing the plenum.

12. A cooling device for cooling an electronic component, the cooling device comprising:
first and second walls that are spaced apart to define an enclosure therebetween, the enclosure hermetically enclosing a liquid coolant within the cooling device, a surface portion of the first wall being adapted to attach the electronic component thereto;
structures between the first and second walls that define an internal channel system within the enclosure, the channel system comprising:
a cavity enclosed by the surface portion of the first wall;
a first group of arborizing channels adapted to carry the liquid coolant away from the cavity, the first group of arborizing channels comprising a parent branch and multiple successive sets of daughter branches with successively smaller cross-sectional areas, wherein the sum of the cross-sectional areas of the daughter branches of any successive set is approximately the same as that of the parent branch thereof, a distal set of the daughter branches being most distant from the cavity and having the smallest cross-sectional areas of the daughter branches;

a second group of arborizing channels adapted to carry the liquid coolant to the cavity, the second group of arborizing channels comprising a parent branch and multiple successive sets of daughter branches with successively smaller cross-sectional areas, wherein the sum of the cross-sectional areas of the daughter branches of any successive set is approximately the same as that of the parent branch thereof, a distal set of the daughter branches being most distant from the cavity and having the smallest cross-sectional areas of the daughter branches;

a third group of arborizing channels adapted to carry the liquid coolant away from the cavity, the third group of arborizing channels being oppositely disposed from the first group of arborizing channels relative to the cavity and comprising a parent branch and multiple successive sets of daughter branches with successively smaller cross-sectional areas, wherein the sum of the cross-sectional areas of the daughter branches of any successive set is approximately the same as that of the parent branch thereof, a distal set of the daughter branches being most distant from the cavity and having the smallest cross-sectional areas of the daughter branches;

a fourth group of arborizing channels adapted to carry the liquid coolant to the cavity, the fourth group of arborizing channels being oppositely disposed from the second group of arborizing channels relative to the cavity and comprising a parent branch and multiple successive sets of daughter branches with successively smaller cross-sectional areas, wherein the sum of the cross-sectional areas of the daughter branches of any successive set is approximately the same as that of the parent branch thereof, a distal set of the daughter branches being most distant from the cavity and having the smallest cross-sectional areas of the daughter branches; and a plenum fluidically connecting at least some of the distal set of the daughter branches of the first group of arborizing channels to at least some of the distal set of the daughter branches of the second group of arborizing channels and fluidically connecting at least some of the distal set of the daughter branches of the third group of arborizing channels to at least some of the distal set of the daughter branches of the fourth group of arborizing channels, the first, second, third and fourth groups of arborizing channels being entirely surrounded by the plenum; and a pump for movement of the liquid coolant from the cavity, through the first group of arborizing channels starting at the parent branch thereof and exiting at the distal set of the daughter branches thereof, through the plenum, through the second group of arborizing channels starting at the distal set of the daughter branches thereof and exiting at the parent branch thereof, and then back to the cavity, and for movement of the liquid coolant from the cavity, through the third group of arborizing channels starting at the parent branch thereof and exiting at the distal set of the daughter branches thereof, through the plenum, through the fourth group of arborizing channels starting at the distal set of the daughter branches thereof and exiting at the parent branch thereof, and then back to the cavity;

wherein the plenum is divided into fluidically separated sections, a first of the sections fluidically connecting some but not all of the distal set of daughter branches of the first group of arborizing channels to some but not all of the distal set of daughter branches of the fourth group of arborizing channels, a second of the sections fluidically connecting some but not all of the distal set of daughter branches of the first group of arborizing channels to some but not all of the distal set of daughter branches of the second group of arborizing channels, a third of the sections fluidically connecting some but not all of the distal set of daughter branches of the third group of arborizing channels to some but not all of the distal set of daughter branches of the second group of arborizing channels, and a fourth of the sections fluidically connecting some but not all of the distal set of daughter branches of the third group of arborizing channels to some but not all of the distal set of daughter branches of the fourth group of arborizing channels.

13. The cooling device of claim 12, further comprising a mesh within the plenum and in thermally conductive contact with the first and second walls of the enclosure.

14. The cooling device of claim 12, wherein the component is attached to an outer surface of the first wall so as not to contact the liquid coolant within the cavity.

15. The cooling device of claim 12, wherein the component passes through the first wall so as to directly contact the liquid coolant within the cavity.

* * * * *